United States Patent
Qian et al.

(10) Patent No.: US 12,433,056 B2
(45) Date of Patent: Sep. 30, 2025

(54) PLANAR GERMANIUM PHOTODETECTOR

(71) Applicant: Intel Corporation, Santa Clara, CA (US)

(72) Inventors: Wei Qian, Walnut, CA (US); Zhi Li, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 769 days.

(21) Appl. No.: 17/555,670

(22) Filed: Dec. 20, 2021

(65) Prior Publication Data

US 2023/0197867 A1  Jun. 22, 2023

(51) Int. Cl.
| | |
|---|---|
| *H10F 77/122* | (2025.01) |
| *H10F 30/223* | (2025.01) |
| *H10F 39/10* | (2025.01) |
| *H10F 71/00* | (2025.01) |
| *H10F 77/14* | (2025.01) |
| *H10F 77/166* | (2025.01) |

(52) U.S. Cl.
CPC ....... *H10F 77/122* (2025.01); *H10F 30/2235* (2025.01); *H10F 71/121* (2025.01); *H10F 71/1212* (2025.01); *H10F 77/147* (2025.01); *H10F 77/1662* (2025.01); *H10F 39/103* (2025.01)

(58) Field of Classification Search
CPC .. H10F 77/122; H10F 30/2235; H10F 71/121; H10F 71/1212; H10F 77/147; H10F 77/1662; H10F 39/103
See application file for complete search history.

(56) References Cited

U.S. PATENT DOCUMENTS

| | | | | |
|---|---|---|---|---|
| 7,397,101 | B1* | 7/2008 | Masini | H10F 30/223 257/656 |
| 9,391,225 | B1* | 7/2016 | Davids | H10F 30/225 |
| 9,813,152 | B2* | 11/2017 | Pinguet | G02B 6/124 |
| 11,393,939 | B2* | 7/2022 | Chern | H10F 77/147 |
| 11,393,940 | B2* | 7/2022 | Chern | H10F 77/206 |
| 11,404,590 | B2* | 8/2022 | Chern | H10F 30/223 |
| 11,855,237 | B2* | 12/2023 | Sze | H10F 39/103 |
| 2009/0101909 | A1* | 4/2009 | Chen | H10F 71/1212 257/65 |
| 2010/0006961 | A1* | 1/2010 | Yasaitis | H10F 39/103 257/431 |
| 2013/0020668 | A1* | 1/2013 | Qian | G02B 6/12004 257/E31.127 |
| 2013/0092980 | A1* | 4/2013 | Na | H10F 77/413 257/E31.037 |

(Continued)

FOREIGN PATENT DOCUMENTS

| | | | | |
|---|---|---|---|---|
| EP | 3961727 | A2 * | 3/2022 | G02F 1/025 |
| WO | WO-2022043513 | A1 * | 3/2022 | G02F 1/025 |

*Primary Examiner* — Earl N Taylor
(74) *Attorney, Agent, or Firm* — Schwabe, Williamson & Wyatt P.C.

(57) ABSTRACT

Embodiments described herein may be related to apparatuses, processes, and techniques directed to a planar germanium photodetector that includes n-type and p-type amorphous silicon deposits on a germanium slab. During operation, a uniform electrical field is formed across the germanium bulk between the amorphous silicon deposits. Other embodiments may be described and/or claimed.

25 Claims, 8 Drawing Sheets

(56) References Cited

U.S. PATENT DOCUMENTS

| | | | |
|---|---|---|---|
| 2013/0182305 A1* | 7/2013 | Feng | G02F 1/025 |
| | | | 438/31 |
| 2018/0101082 A1* | 4/2018 | Yu | H10F 77/413 |
| 2020/0286871 A1* | 9/2020 | Liff | H01L 21/4857 |
| 2020/0313021 A1* | 10/2020 | Fujikata | H10F 77/14 |
| 2021/0223478 A1* | 7/2021 | Song | G02B 6/131 |
| 2022/0099486 A1* | 3/2022 | Takeda | H10F 77/206 |
| 2022/0320361 A1* | 10/2022 | Takeda | H10F 30/24 |
| 2023/0197867 A1* | 6/2023 | Qian | G02B 6/1347 |
| 2025/0006856 A1* | 1/2025 | Lischke | H10F 77/122 |

* cited by examiner

PLANAR GERMANIUM PHOTODETECTOR

FIELD

Embodiments of the present disclosure generally relate to the field of semiconductor photonics, and in particular to photodetectors.

BACKGROUND

Continued growth in virtual machines, cloud computing, and portable devices will continue to increase the demand for high bandwidth communication between chips and packages.

DETAILED DESCRIPTION

Embodiments described herein may be related to apparatuses, processes, systems, and techniques directed to a planar germanium photodetector that includes n-type and p-type amorphous silicon deposits on a germanium slab. In embodiments, during operation a uniform current path is enabled and a uniform electrical field is formed across a germanium bulk between the amorphous silicon deposits. In embodiments, the amorphous silicon deposits may be highly doped, and may serve as a contact and conductive layer connecting a PN junction to metal. In embodiments, this may reduce series resistance between the PN junction and the metal contact.

Embodiments of the photodetector may provide 90 to 120 GHz bandwidth during operation. In embodiments, the planar structure of the photodetector may result in straightforward integration with a silicon optical waveguide and other photonic components. In addition, it may result in lower leakage currents with respect to legacy implementations, and produce a more reliable device. In addition, in embodiments, the planar structure is amenable to complementary metal-oxide-semiconductor (CMOS) manufacturing process integration. In embodiments, amorphous silicon is used a conductive layer, with the planarized photodetector structure requiring just one metal layer to connect the photodetector with other electrical components.

In legacy silicon photonics, germanium P-i-N (PIN) junctions may be used as a photodetector. Legacy vertical PIN photodetector device implementations, discussed below with respect to FIG. 1, have a speed that is limited by the device size and a required germanium thickness. Legacy lateral PIN implementations, discussed below with respect to FIG. 2, may have a reduced size; however, a non-uniform electrical field results due to the placement of the germanium, and high series resistance on a thin silicon slab limits the speed of these legacy devices. In addition, these legacy PIN structures create a surface topology that requires a dedicated metal manufacturing process to create the P and N contacts, increasing overall manufacturing costs.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

Figure 1:
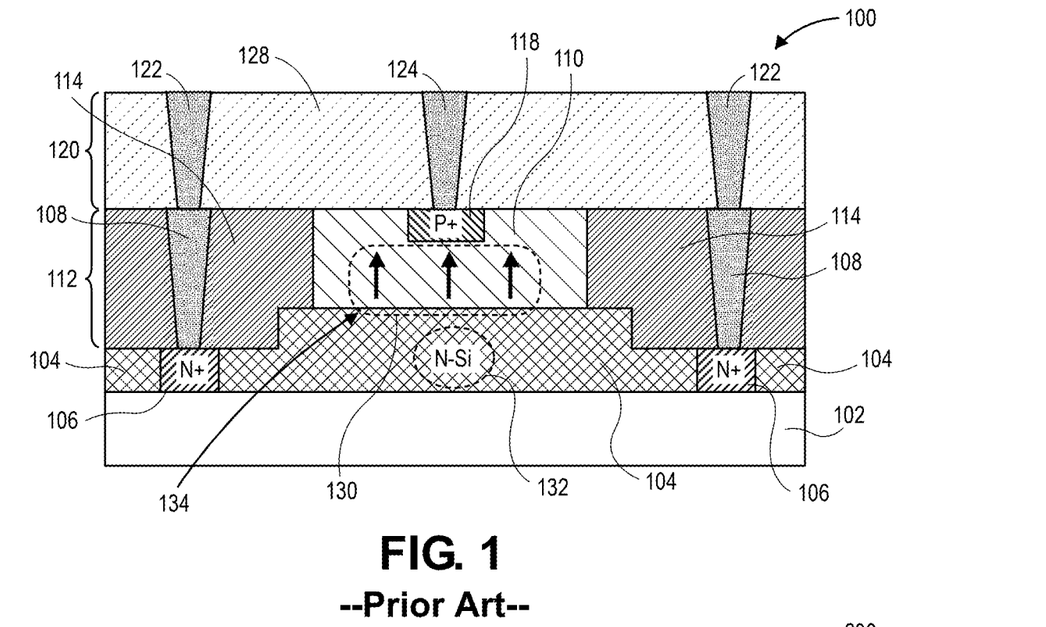
FIG. 1 illustrates a cross-section side view of a legacy vertical photodetector.

FIG. 1 illustrates a cross-section side view of a legacy vertical photodetector. Legacy vertical photodetector 100 includes a buried oxide (BOX) layer 102, onto which an n-type silicon layer 104 is placed. A germanium layer 110 may be placed on top of the n-type silicon 104. Within the n-type silicon 104, N+ doped regions 106 may be formed, that may in turn be coupled with metal connectors 108 within a first metal layer 112. In implementations, the first metal layer 112 may also include a dielectric 114, which may include silicon dioxide.

In legacy implementations, a P+ doped region 118 may be placed on top of the germanium layer 110. In implementations, a second metal layer 120 may include metal connectors 122 that are coupled with metal connectors 108. In implementations, a metal connector 124 may be coupled with the P+ doped region 118. In embodiments, the second metal layer 120 may also include a dielectric 128, which may include silicon dioxide.

Optical waveguide cross section 132 shows where light may enter the n-type silicon layer 104, and will subsequently be coupling into the germanium layer 110. During operation of legacy vertical photodetector 100, an electrical field 130 may be created in a vertical direction as shown. Because the electric field 130 is in a vertical direction, the device speed of the legacy vertical photodetector 100 will be limited by the thickness of the germanium layer 110.

In addition, because the P+ doped region 118 is placed on top of the germanium layer 110, an overall height reduction of the legacy vertical photodetector 100 is limited. This limited height reduction also limits the device speed due to the additional distance electrical signals need to travel. Carriers will have long transit times in thick germanium. In these legacy implementations, there may be a high degree of defects at the germanium layer 110/n-type silicon layer 104, interface 134 due to a lattice mismatch between the germanium and silicon. As a result, current passing through this interface 134 will cause high current leakage and impact device reliability due to crystalline defects along the interface 134. These crystalline defects provide current leakage paths, which may become worse over time when bias and current is applied. These crystalline defects may cause device malfunction and shorten device lifetime when current leakage exceeds specifications. In addition, the topology of the various layers of the legacy vertical photodetector 100 make it difficult for integration with legacy CMOS manufacturing processes. This is particularly true given the two different levels of metal layers 112, 120 required to electrically couple with the P+ doped region 118 and the N+ doped regions 106.

Figure 2:
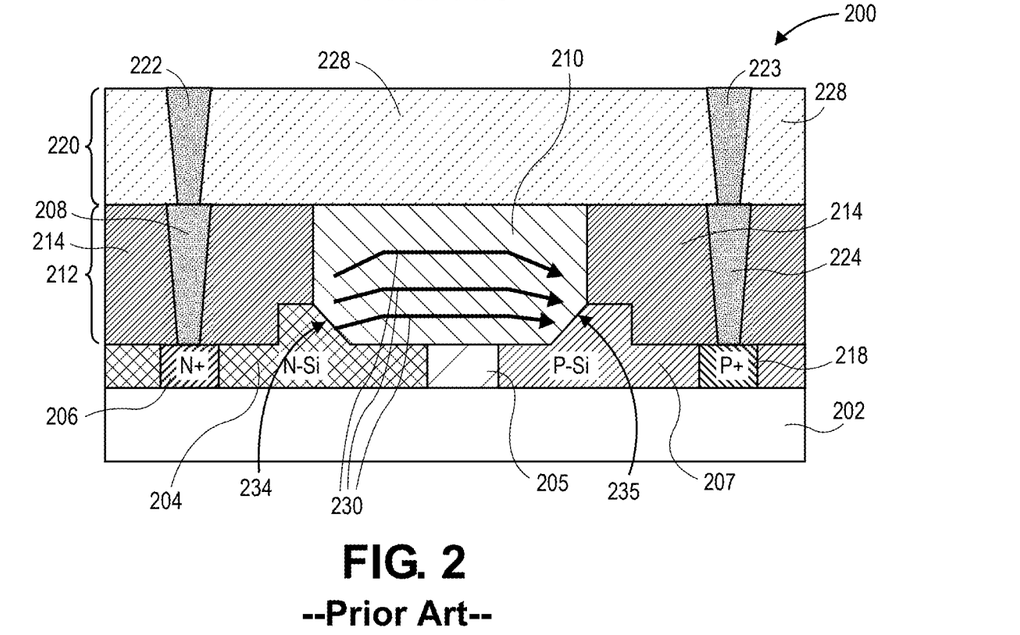
FIG. 2 illustrates a cross section side view of a legacy horizontal photodetector.

FIG. 2 illustrates a cross section side view of a legacy horizontal photodetector. Legacy horizontal photodetector 200 includes a BOX layer 202 onto which an n-type silicon layer 204 and an N+ doped region 206 may be applied. In addition, a silicon waveguide layer 205 is also applied on the BOX layer 202. Also, a p-type silicon layer 207 and a P+ doped region 218 may also be applied on the BOX layer 202. A metal connector 208 electrically couples with the N+ doped region 206 and a metal connector 224 electrically couples with the P+ doped region 218 within a first metal layer 212. A dielectric 214 is included within the first metal layer 212, and may include silicon dioxide. A second metal layer 220 may be applied on the first metal layer 212, and includes a metal connector 222 to electrically couple with the N+ doped region 206. The second metal layer 220 also includes a metal connector 223 to electrically couple with the P+ doped region 218. The second metal layer 220 may also include a dielectric 228.

In implementations, a germanium bulk layer 210 may be applied on the n-silicon layer 204, the silicon waveguide 205, and the p-type silicon layer 207 within the first metal layer 212. During operation of the legacy horizontal photodetector 200, as light enters from the waveguide 205, it is drawn up into the germanium bulk layer 210. An electrical current passing from the n-type silicon layer 204 to the p-type silicon layer 207 will create an electrical field 230. As shown, the electrical field 230 is not uniform, and it becomes weaker toward the top of the germanium bulk layer 210. As a result, this lowers the speed of the legacy horizontal photodetector 200, particularly as a thickness of the germanium bulk layer 210 is increased, for example for more light absorption and higher device responsibility.

Also, there may be a high degree of defects at the germanium bulk layer 210/n-type silicon layer 204, interface 234, as well as at the germanium layer 210/p-type silicon layer 207, interface 235 due to a lattice mismatch between germanium and silicon. As a result, current passing through these interfaces 234, 235 will cause high current leakage and impact device reliability as described above. In addition, the topology of the various layers of the legacy horizontal photodetector 200 and make it difficult for integration with CMOS manufacturing processes. Also, there may be a parasitic silicon PIN in parallel with an active silicon/germanium PIN, for example, a first PIN n-type silicon layer 204, germanium layer 210, p-type silicon layer 207 and a second PIN below n-type silicon layer 204, silicon waveguide 205, p-type silicon layer 207.

Figure 3:
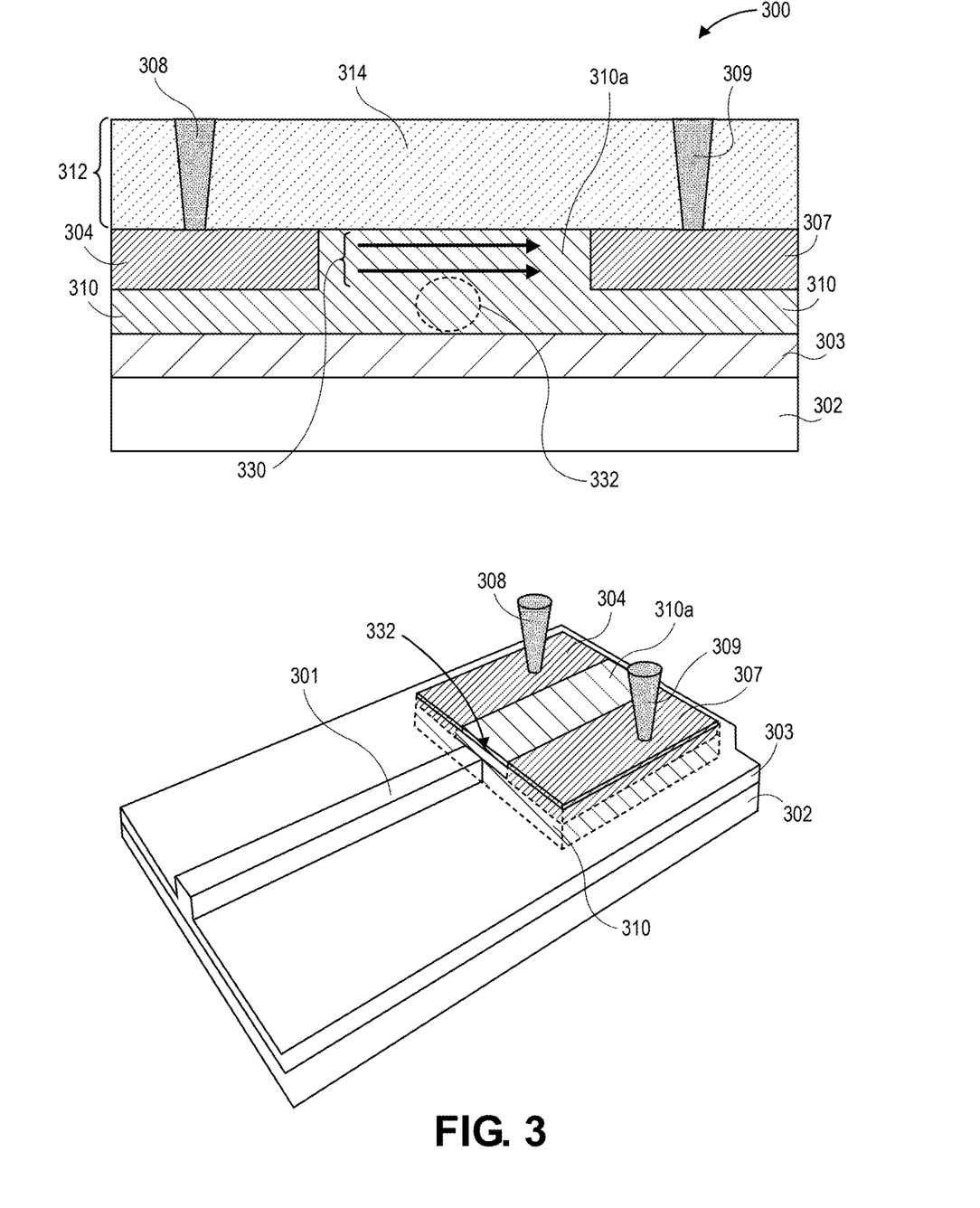
FIG. 3 illustrates a cross section side view and a perspective view of a planar germanium photodetector, in accordance with various embodiments.

FIG. 3 illustrates a cross section side view and a perspective view of a planar germanium photodetector, in accordance with various embodiments. Photodetector 300 includes a BOX layer 302 onto which silicon layer 303 may be applied. On top of the silicon layer 303, a bulk germanium layer 310 may be applied. In embodiments, an n-type amorphous silicon 304 may be at least partially embedded within the bulk germanium layer 310, and a p-type amorphous silicon 307 may be at least partially embedded within the bulk germanium layer 310.

In embodiments, the n-type amorphous silicon 304 and the p-type amorphous silicon 307 may be layers, and may be formed within a same plane by a polish process. In embodiments, the n-type amorphous silicon 304 and the p-type amorphous silicon 307 may be isolated from the silicon layer 303 by a portion of the bulk germanium layer 310. In embodiments, a portion of the germanium layer 310a may isolate the n-type amorphous silicon 304 and the p-type amorphous silicon 307 from each other.

In embodiments, a first metal layer 312 may be placed on the top of the n-type amorphous silicon 304 and the p-type amorphous silicon 307, as well as on a top of the portion of the germanium layer 310a. In embodiments, a first metal contact 308 may be electrically coupled with the n-type amorphous silicon 304, and a second metal contact 309 may be electrically coupled with the p-type amorphous silicon 307. In embodiments, a dielectric 314 may also be included in the first metal layer 312.

During operation of the photodetector 300, light may enter from waveguide 301 into the bulk germanium layer 310 at an interface location 332. The electric current passing from the n-type amorphous silicon 304 through the portion of the germanium layer 310a to the p-type amorphous silicon 307 creates a uniformly distributed electric field 330, through which the light may pass. In embodiments, during operation, the germanium layer 310a absorbs light and creates carriers, and a current is formed when a bias/electrical field is applied, converting the optical signal to an electrical signal.

Figure 4A:
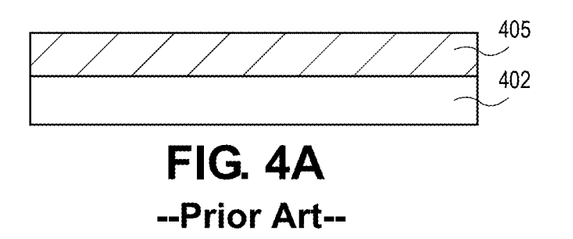
FIG. 4A-4F illustrates stages in a legacy manufacturing process for manufacturing a legacy horizontal photodetector.

FIGS. 4A-4F illustrates stages in a legacy manufacturing process for manufacturing a legacy horizontal photodetector. FIG. 4A shows a stage in the manufacturing process where a BOX layer 402 is identified, and a silicon layer 405 is formed on top of the BOX layer 402.

Figure 4B:
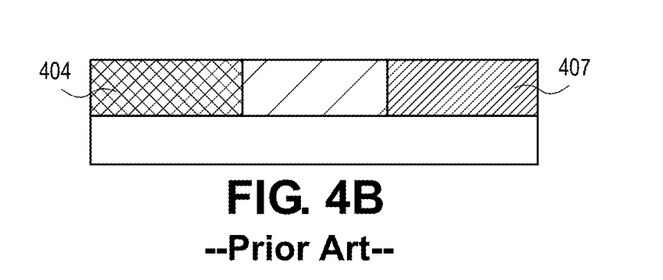

FIG. 4B shows a stage in the legacy manufacturing process where an implanting process is performed, to form an n-type region 404 within the silicon layer 405, and to form a p-type region 407 within the silicon layer 405.

Figure 4C:
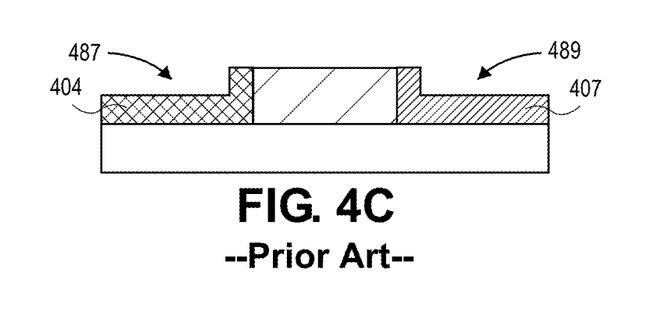

FIG. 4C shows a stage in the legacy manufacturing process where portion 487 of the n-type region 404 is etched away, and portion 489 of the p-type region 407 is etched away and a silicon waveguide is formed.

Figure 4D:
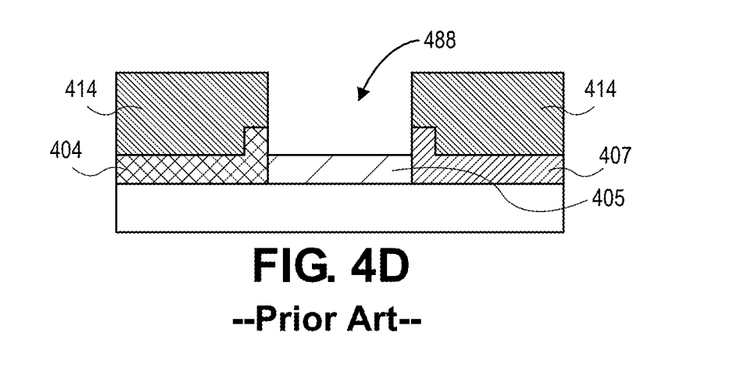

FIG. 4D shows a stage in the legacy manufacturing process where a dielectric 414 is placed on top of the n-type region 404, silicon layer 405, p-type region 407, and then a cavity 488 is etched down to and partially through the silicon layer 405.

Figure 4E:
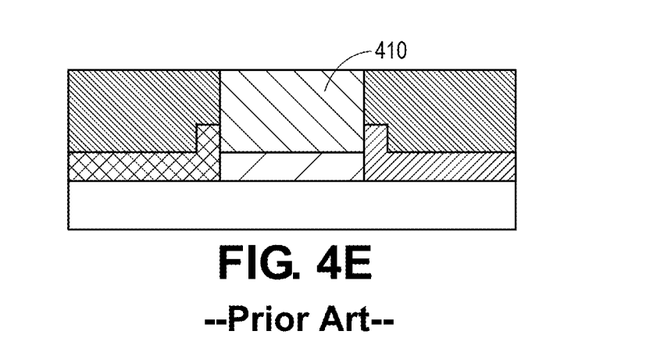

FIG. 4E shows a stage in the legacy manufacturing process where germanium 410 is placed within the cavity 488, and a polishing step has been performed.

Figure 4F:
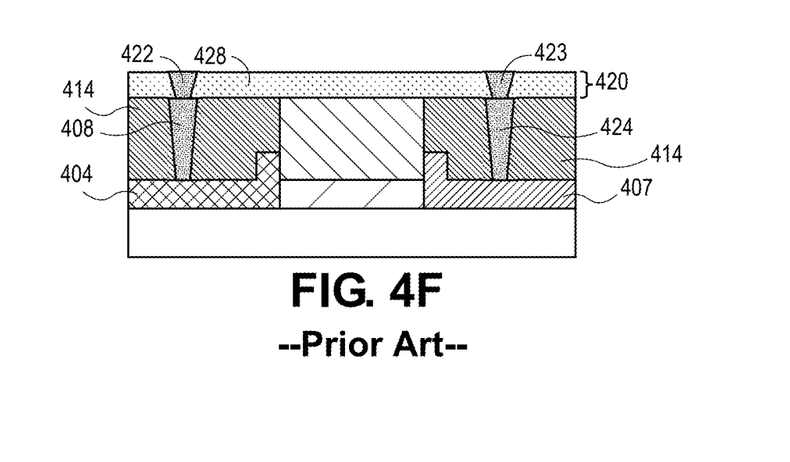

FIG. 4F shows a stage in the legacy manufacturing process where a first metal contact 408 is formed through the dielectric 414 and electrically coupled with the n-type region 404, and a second metal contact 424 is formed through the dielectric 414 and electrically coupled with the p-type region 407. Another metal layer 420 may be placed on top of the dielectric 414, and a first additional metal contact 422 is electrically coupled through the metal layer 420 to the first metal contact 408. A second additional metal contact 423 is electrically coupled through the metal layer 420 to the second metal contact 424. The metal layer 420 may also include a dielectric 428.

Figure 5A:
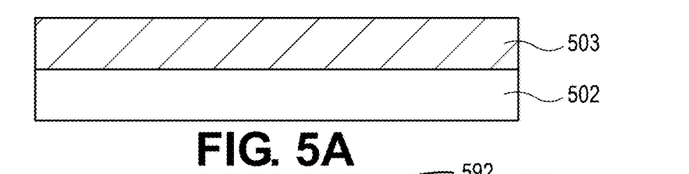
FIG. 5A-5F illustrates stages in a manufacturing process for manufacturing a planar germanium photodetector, in accordance with various embodiments.

FIGS. 5A-5F illustrates stages in a manufacturing process for manufacturing a planar germanium photodetector, in accordance with various embodiments. FIG. 5A shows a stage in the manufacturing process where a BOX layer 502 is identified, which may be similar to BOX layer 402 FIG. 4, and the silicon layer 503 is formed on top of the BOX layer 502.

Figure 5B:
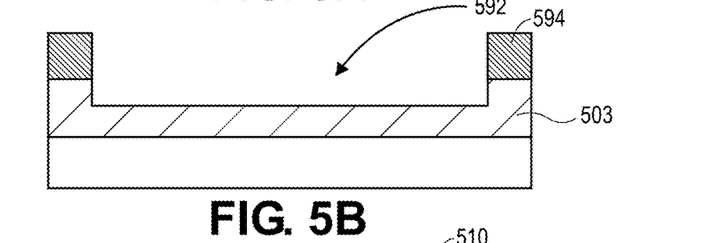

FIG. 5B, shows a stage in the manufacturing process where a dielectric 594 may be placed on the silicon layer 503, and then etching process is applied to produce cavity 592 extending through the dielectric layer 594 and partially into the silicon layer 503.

Figure 5C:
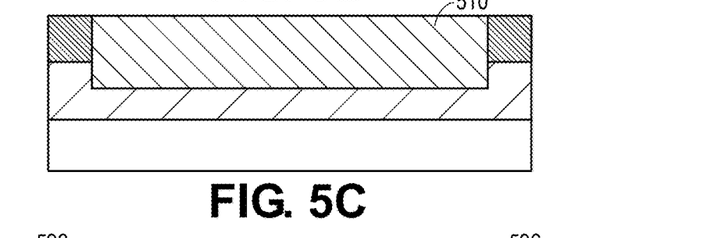

FIG. 5C shows a stage in the manufacturing process where a germanium layer 510, which may be similar to germanium layer 310 of FIG. 3, is placed. In embodiments, the germanium layer 510 may be a bulk germanium.

Figure 5D:
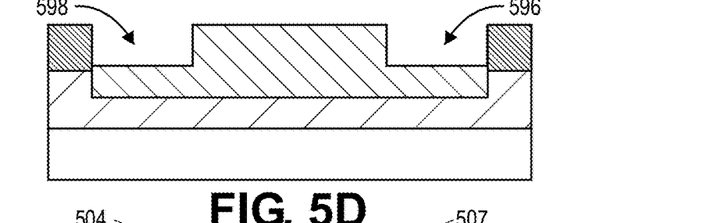

FIG. 5D shows a stage in the manufacturing process where cavities 596, 598 are etched into the germanium layer 510, where the germanium waveguide is formed.

Figure 5E:
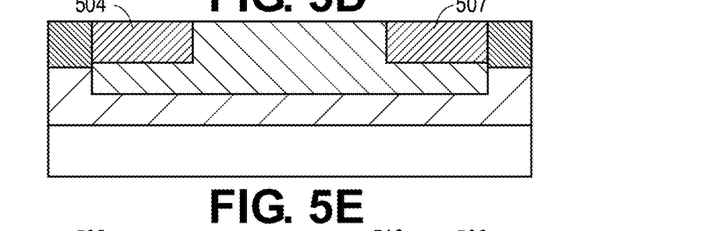

FIG. 5E shows a stage in the manufacturing process where an n-type amorphous silicon layer 504 is applied within cavity 598, and a p-type amorphous silicon layer 507 is applied within cavity 596. In embodiments, amorphous silicon may be applied using chemical vapor deposition techniques. In embodiments, the n-type amorphous silicon layer 504 may be similar to n-type amorphous silicon 304, and the p-type amorphous silicon layer 507 may be similar to p-type amorphous silicon 307 of FIG. 3.

Figure 5F:
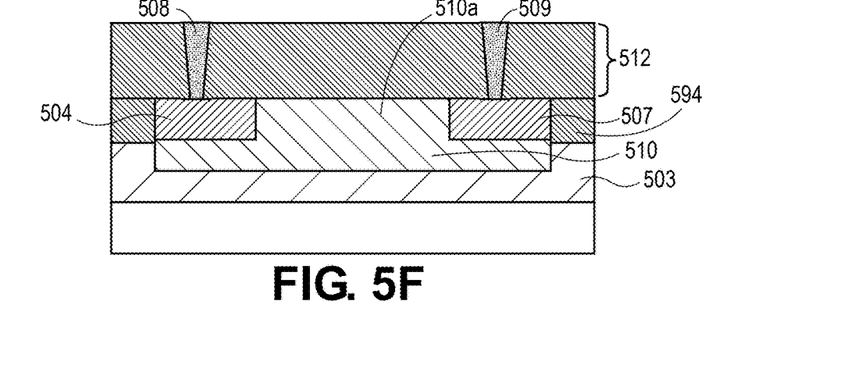

FIG. 5F shows the stage in the manufacturing process where the metal layer 512, is formed on a surface of the n-type amorphous silicon layer 504, the p-type amorphous silicon layer 507, and the germanium layer 510. Metal contact 508 is formed within the metal layer 512 to electrically couple with the n-type amorphous silicon layer 504, and metal contact 509 is formed within the metal layer 512 to electrically couple with the p-type amorphous silicon layer 507. As a result, partial germanium layer 510a, which may be similar to partial germanium layer 310a of FIG. 3, is formed that provides a direct path of electrical current and resulting even electrical field between the n-type amorphous silicon layer 504 and the p-type amorphous silicon layer 507 during photodetector operation.

Figure 6:
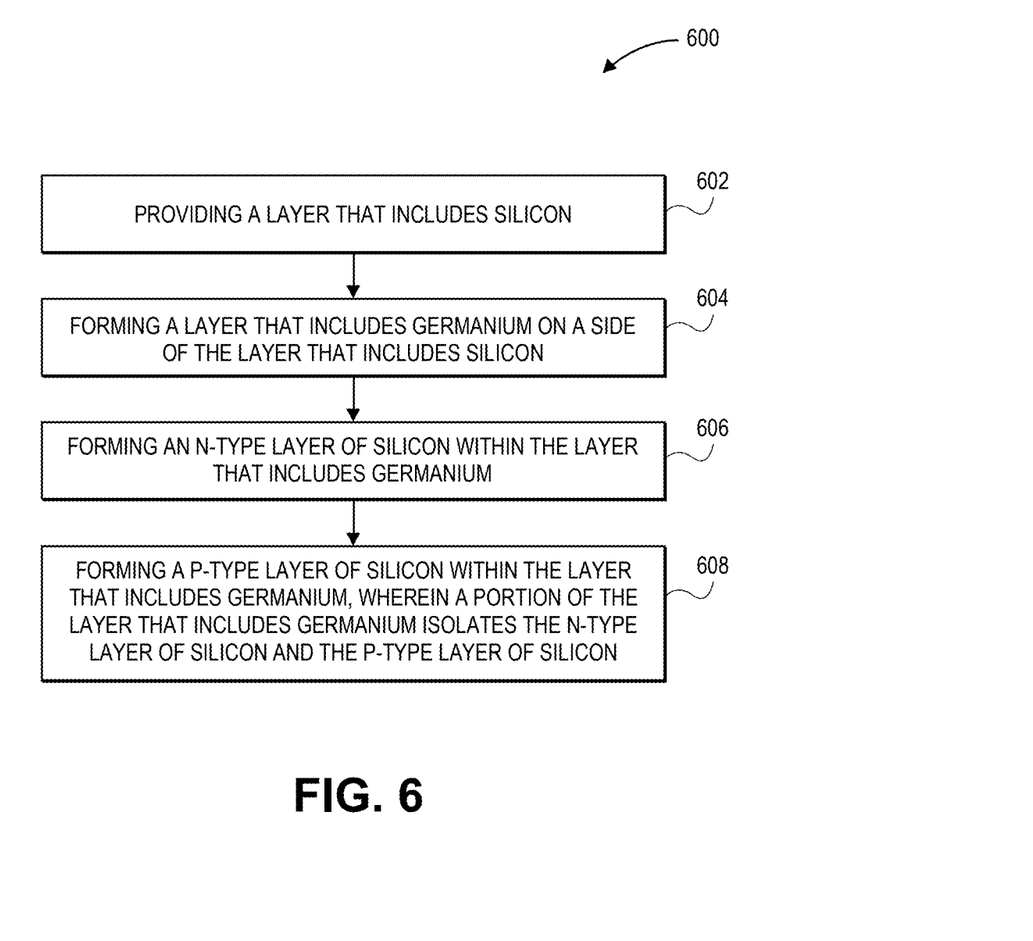
FIG. 6 illustrates a process for manufacturing a planar germanium photodetector, in accordance with various embodiments.

FIG. 6 illustrates an example process for manufacturing a planar germanium photodetector, in accordance with various embodiments.

Process 600 may be implemented using the techniques and/or embodiments described herein, and in particular with respect to FIGS. 1-5F.

At block 602, the process may include providing a layer that includes silicon. In embodiments, the layer that includes silicon may be similar to silicon layer 303 of FIG. 3.

At block 604, the process may further include forming a layer that includes germanium on a side of the layer that includes silicon. In embodiments, the layer that includes germanium may be similar to bulk germanium layer 310 of FIG. 3.

At block 606, the process may further include forming an n-type layer of silicon within the layer that includes germanium. In embodiments the n-type layer of silicon may be similar to n-type layer of amorphous silicon 304 of FIG. 3

At block 608, the process may further include forming a p-type layer of silicon within the layer that includes germanium, wherein a portion of the layer that includes germanium isolates the n-type layer of silicon and the p-type layer of silicon. In embodiments the p-type layer of silicon may be similar to p-type layer of amorphous silicon 307 of FIG. 3. In embodiments, the portion of the layer that includes germanium isolates the n-type layer of silicon and the p-type layer of silicon may be similar to portion 310 of the bulk germanium layer of FIG. 3.

In embodiments, after block 604, a germanium layer etch may be performed to form a germanium waveguide, with amorphous silicon deposited and doped with n-type and p-type at each side of the waveguide.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or gate-all-around transistors such as nanoribbon and nanowire transistors. Although the implementations described herein may illustrate only Finfet transistors, it should be noted that the invention may also be carried out using planar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 7:
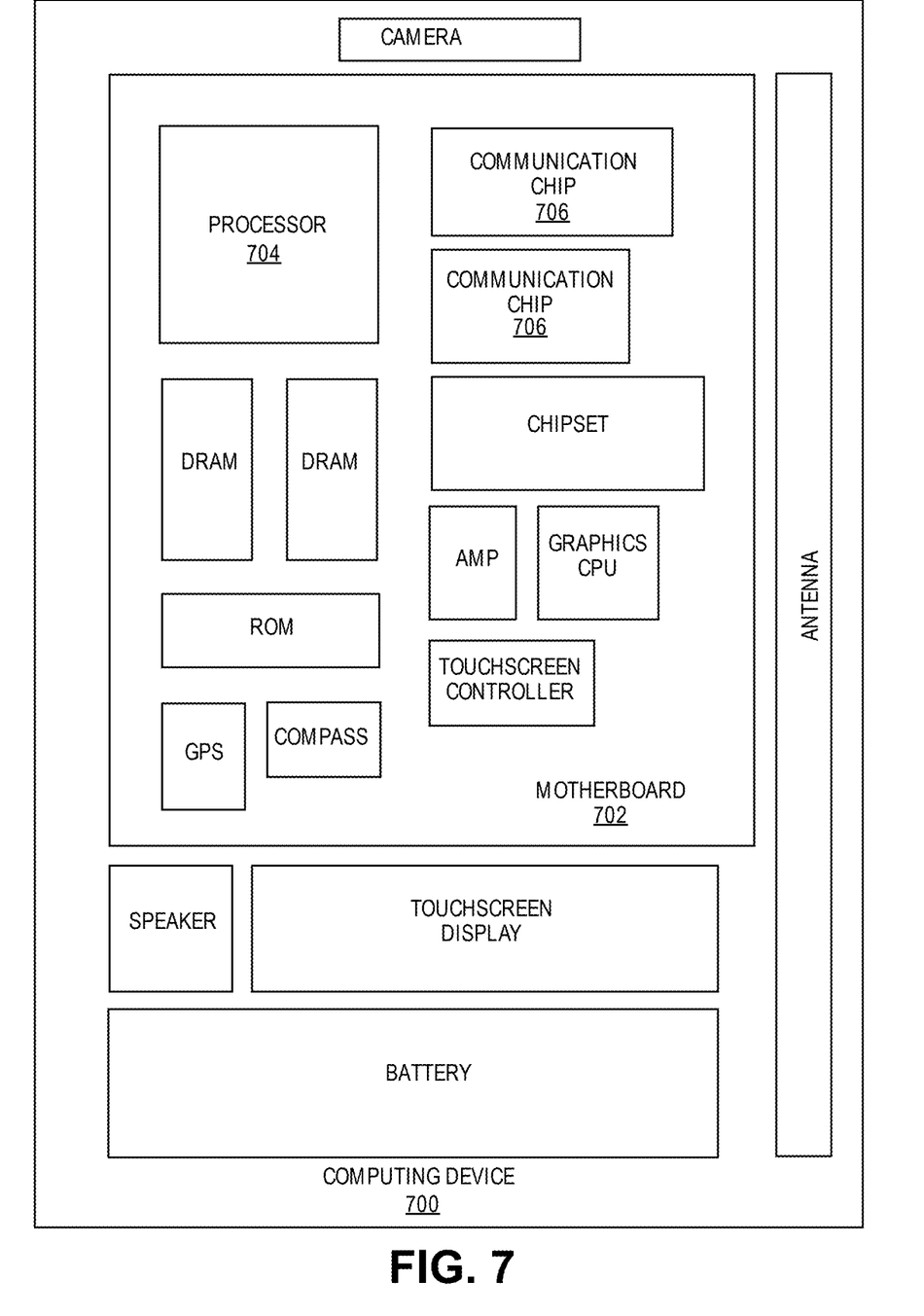
FIG. 7 illustrates a computing device 700 in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
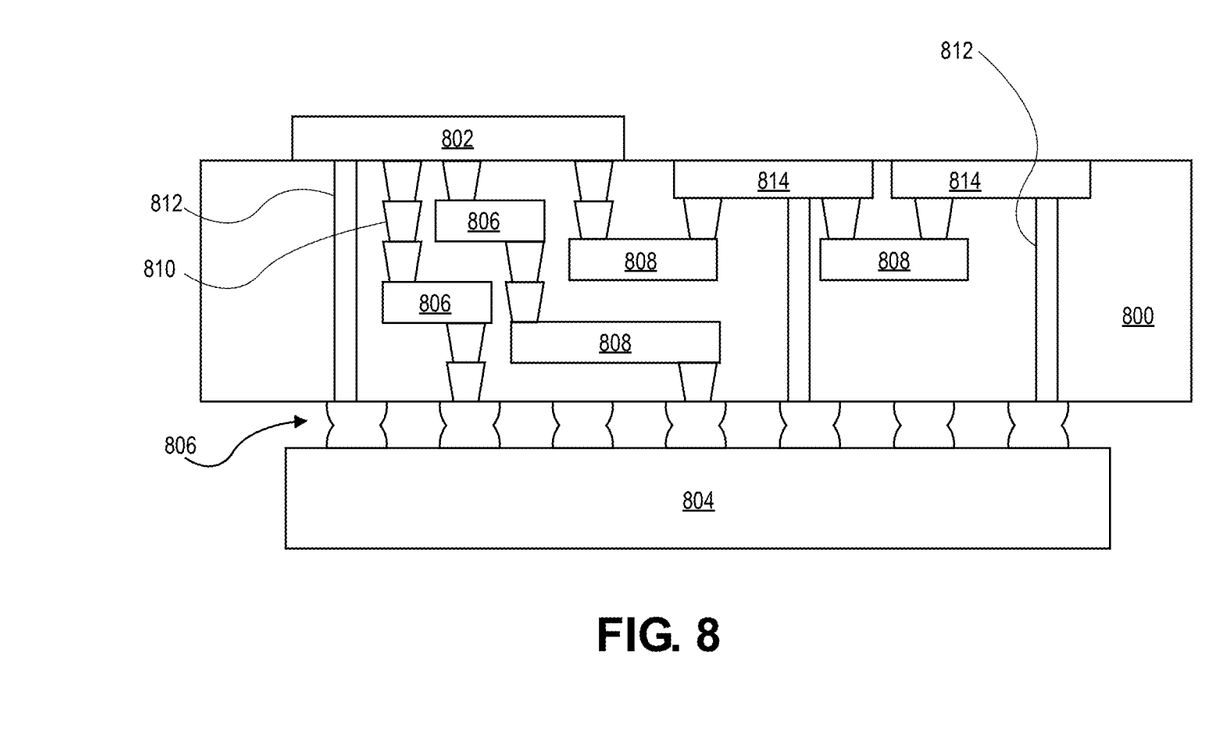
FIG. 8 illustrates an interposer 800 that includes one or more embodiments of the invention.

FIG. 8 illustrates an interposer 800 that includes one or more embodiments of the invention. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer 800 may be formed of alternate rigid or flexible materials that may include the same materials described above for use in a semiconductor substrate, such as silicon, germanium, and other group III-V and group IV materials.

The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the invention, apparatuses or processes disclosed herein may be used in the fabrication of interposer 800.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a photodetector comprising: a substrate; a germanium layer on top of the substrate; and an n-type silicon layer at least partially within the germanium layer and a p-type silicon layer at least partially within the germanium layer, wherein a portion of the germanium layer between the n-type silicon layer and the p-type silicon layer isolates the n-type silicon layer and the p-type silicon layer from each other.

Example 2 includes the photodetector of example 1, or of any other example or embodiment herein, wherein the portion of the germanium layer between the n-type silicon layer and the p-type silicon layer is a first portion; and further comprising second portion of the germanium layer that separates the n-type silicon layer and the p-type silicon layer from the substrate.

Example 3 includes the photodetector of example 1, or of any other example or embodiment herein, wherein the n-type silicon layer is an amorphous silicon layer, and wherein the p-type silicon layer is an amorphous silicon layer.

Example 4 includes the photodetector of example 1, or of any other example or embodiment herein, further comprising a waveguide optically coupled with the portion of the germanium layer between the n-type silicon layer and the p-type silicon layer.

Example 5 includes the photodetector of example 4, or of any other example or embodiment herein, wherein the waveguide is a silicon waveguide.

Example 6 includes the photodetector of example 1, or of any other example or embodiment herein, wherein, during operation of the photo detector, current flows from the n-type silicon layer to the p-type silicon layer through the portion of the germanium layer.

Example 7 includes the photodetector of example 1, or of any other example or embodiment herein, wherein, during operation of the photodetector, an electric field forms within the portion of the germanium layer, wherein the formed electric field is substantially uniform.

Example 8 includes the photodetector of example 1, or of any other example or embodiment herein, wherein a thickness of the n-type silicon layer and a thickness of the p-type silicon layer ranges from 0.1 µm to 0.2 µm.

Example 9 includes the photodetector of example 1, or of any other example or embodiment herein, wherein a minimum distance between the n-type silicon layer and the p-type silicon layer ranges from 0.2 µm to 0.6 µm.

Example 10 includes the photodetector of example 1, or of any other example or embodiment herein, wherein an edge plane of the n-type silicon layer proximate to the p-type silicon layer, and an edge plane of the p-type silicon layer proximate to the n-type silicon layer are substantially parallel.

Example 11 includes the photodetector of example 1, or of any other example or embodiment herein, further comprising a first electrical contact electrically coupled with the n-type layer of silicon and a second electrical contact electrically coupled with the p-type layer of silicon.

Example 12 includes the photodetector of example 11, or of any other example or embodiment herein, wherein the first electrical contact and the second electrical contact are within a metal layer.

Example 13 includes the photodetector of example 1, or of any other example or embodiment herein, wherein the substrate is a silicon substrate.

Example 14 includes the photodetector of example 1, or of any other example or embodiment herein, wherein the substrate is on a buried oxide (BOX) layer.

Example 15 is a method comprising: providing a layer that includes silicon; forming a layer that includes germanium on a side of the layer that includes silicon; forming an n-type layer of silicon within the layer that includes germanium; and forming a p-type layer of silicon within the layer that includes germanium, wherein a portion of the layer that includes germanium isolates the n-type layer of silicon and the p-type layer of silicon.

Example 16 includes the method of example 15, or of any other example or embodiment herein, wherein the n-type layer of silicon and the p-type layer of silicon are separated from the layer that includes silicon by a portion of the layer that includes germanium.

Example 17 includes the method of example 15, or of any other example or embodiment herein, wherein the n-type silicon layer is an amorphous silicon layer, and wherein the p-type silicon layer is an amorphous silicon layer.

Example 18 includes the method of example 15, or of any other example or embodiment herein, wherein forming the n-type layer of silicon further includes: etching a first cavity within the layer of germanium; and forming the n-type layer of silicon within the first cavity; and wherein forming the p-type layer of silicon further includes: etching a second cavity within the layer of germanium; and forming the p-type layer of silicon within the second cavity.

Example 19 includes the method of example 15, or of any other example or embodiment herein, further comprising: forming a first metal conductor on the n-type layer of silicon; and forming a second metal conductor on the p-type layer of silicon.

Example 20 includes the method of example 15, or of any other example or embodiment herein, wherein a thickness of the n-type layer of silicon and a thickness of the p-type layer of silicon ranges from 0.1 µm to 0.3 µm, or wherein a minimum distance between the n-type layer of silicon and the p-type layer of silicon ranges from 0.2 µm to 0.6 µm.

Example 21 is a package comprising: a photodetector comprising: a silicon substrate; a germanium layer on top of the silicon substrate; an n-type amorphous silicon layer at least partially within the germanium layer and a p-type amorphous silicon layer at least partially within the germanium layer, wherein a portion of the germanium layer between the n-type amorphous silicon layer and the p-type amorphous silicon layer isolates the n-type amorphous silicon layer and the p-type amorphous silicon layer from each other, and wherein the n-type amorphous silicon layer and the p-type amorphous silicon layer are within a plane; a first electrical contact electrically coupled with the n-type amorphous silicon layer; and a second electrical contact electrically coupled with the p-type amorphous silicon layer; and an electrical component electrically coupled with the first electrical contact and the second electrical contact.

Example 22 includes the package of example 21, or of any other example or embodiment herein, further comprising a waveguide optically coupled with the portion of the germanium layer between the n-type amorphous silicon layer and the p-type amorphous silicon layer.

Example 23 includes the package of example 21, or of any other example or embodiment herein, wherein the electrical component includes a selected one of: a central processing unit (CPU), a graphics processing unit (GPU), a field programmable gate array (FPGA), or memory.

Example 24 includes the package of example 21, or of any other example or embodiment herein, wherein during operation of the photodetector, an electric field forms within the portion of the germanium layer, wherein the formed electric field is substantially uniform.

Example 25 includes the package of example 21, or of any other example or embodiment herein, wherein the photodetector is a plurality of photo detectors, and wherein the electrical component is a plurality of electrical components.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A photodetector comprising:
   a substrate;
   a germanium layer on top of the substrate; and
   an n-type silicon layer at least partially within the germanium layer and a p-type silicon layer at least partially within the germanium layer, wherein a portion of the germanium layer between the n-type silicon layer and the p-type silicon layer isolates the n-type silicon layer and the p-type silicon layer from each other, the n-type silicon layer having an uppermost surface at a same level as an uppermost surface of the germanium layer, and the p-type silicon layer having an uppermost surface at a same level as the uppermost surface of the germanium layer.

2. The photodetector of claim 1, wherein the portion of the germanium layer between the n-type silicon layer and the p-type silicon layer is a first portion; and further comprising second portion of the germanium layer that separates the n-type silicon layer and the p-type silicon layer from the substrate.

3. The photodetector of claim 1, wherein the n-type silicon layer is an amorphous silicon layer, and wherein the p-type silicon layer is an amorphous silicon layer.

4. The photodetector of claim 1, further comprising a waveguide optically coupled with the portion of the germanium layer between the n-type silicon layer and the p-type silicon layer.

5. The photodetector of claim 4, wherein the waveguide is a silicon waveguide.

6. The photodetector of claim 1, wherein, during operation of the photo detector, current flows from the n-type silicon layer to the p-type silicon layer through the portion of the germanium layer.

7. The photodetector of claim 1, wherein, during operation of the photodetector, an electric field forms within the portion of the germanium layer, wherein the formed electric field is substantially uniform.

8. The photodetector of claim 1, wherein a thickness of the n-type silicon layer and a thickness of the p-type silicon layer ranges from 0.1 µm to 0.2 µm.

9. The photodetector of claim 1, wherein a minimum distance between the n-type silicon layer and the p-type silicon layer ranges from 0.2 µm to 0.6 µm.

10. The photodetector of claim 1, wherein an edge plane of the n-type silicon layer proximate to the p-type silicon layer, and an edge plane of the p-type silicon layer proximate to the n-type silicon layer are substantially parallel.

11. The photodetector of claim 1, further comprising a first electrical contact electrically coupled with the n-type layer of silicon and a second electrical contact electrically coupled with the p-type layer of silicon.

12. The photodetector of claim 11, wherein the first electrical contact and the second electrical contact are within a metal layer.

13. The photodetector of claim 1, wherein the substrate is a silicon substrate.

14. The photodetector of claim 1, wherein the substrate is on a buried oxide (BOX) layer.

15. A method comprising:
    providing a layer that includes silicon;
    forming a layer that includes germanium on a side of the layer that includes silicon;
    forming an n-type layer of silicon within the layer that includes germanium, the n-type layer of silicon having an uppermost surface at a same level as an uppermost surface of the layer that incudes germanium; and
    forming a p-type layer of silicon within the layer that includes germanium, the p-type layer of silicon having an uppermost surface at a same level as the uppermost surface of the layer that includes germanium, wherein a portion of the layer that includes germanium isolates the n-type layer of silicon and the p-type layer of silicon.

16. The method of claim 15, wherein the n-type layer of silicon and the p-type layer of silicon are separated from the layer that includes silicon by a portion of the layer that includes germanium.

17. The method of claim 15, wherein the n-type silicon layer is an amorphous silicon layer, and wherein the p-type silicon layer is an amorphous silicon layer.

18. The method of claim 15, wherein forming the n-type layer of silicon further includes:
    etching a first cavity within the layer of germanium; and
    forming the n-type layer of silicon within the first cavity; and
    wherein forming the p-type layer of silicon further includes:
    etching a second cavity within the layer of germanium; and
    forming the p-type layer of silicon within the second cavity.

19. The method of claim 15, further comprising:
    forming a first metal conductor on the n-type layer of silicon; and
    forming a second metal conductor on the p-type layer of silicon.

20. The method of claim 15, wherein a thickness of the n-type layer of silicon and a thickness of the p-type layer of silicon ranges from 0.1 µm to 0.3 µm, or wherein a minimum distance between the n-type layer of silicon and the p-type layer of silicon ranges from 0.2 µm to 0.6 µm.

21. A package comprising:
    a photodetector comprising:
    a silicon substrate;
    a germanium layer on top of the silicon substrate;
    an n-type amorphous silicon layer at least partially within the germanium layer and a p-type amorphous silicon layer at least partially within the germanium layer, wherein a portion of the germanium layer between the n-type amorphous silicon layer and the p-type amorphous silicon layer isolates the n-type amorphous silicon layer and the p-type amorphous silicon layer from each other, the n-type silicon layer having an uppermost surface at a same level as an uppermost surface of the germanium layer, and the p-type silicon layer having an uppermost surface at a same level as the uppermost surface of the germanium layer, and wherein the n-type amorphous silicon layer and the p-type amorphous silicon layer are within a plane;

a first electrical contact electrically coupled with the n-type amorphous silicon layer; and a second electrical contact electrically coupled with the p-type amorphous silicon layer; and an electrical component electrically coupled with the first electrical contact and the second electrical contact.

22. The package of claim 21, further comprising a waveguide optically coupled with the portion of the germanium layer between the n-type amorphous silicon layer and the p-type amorphous silicon layer.

23. The package of claim 21, wherein the electrical component includes a selected one of: a central processing unit (CPU), a graphics processing unit (GPU), a field programmable gate array (FPGA), or memory.

24. The package of claim 21, wherein during operation of the photodetector, an electric field forms within the portion of the germanium layer, wherein the formed electric field is substantially uniform.

25. The package of claim 21, wherein the photodetector is a plurality of photo detectors, and wherein the electrical component is a plurality of electrical components.

* * * * *